(12) United States Patent
Lee et al.

(10) Patent No.: US 10,306,778 B2
(45) Date of Patent: May 28, 2019

(54) PRINTED CIRCUIT BOARD WITH DAM AROUND CAVITY AND MANUFACTURING METHOD THEREOF

(71) Applicant: SAMSUNG ELECTRO-MECHANICS CO., LTD., Suwon-si (KR)

(72) Inventors: Jae-Ean Lee, Busan-si (KR); Jee-Soo Mok, Yongin-si (KR); Young-Gwan Ko, Seoul (KR); Soon-Oh Jung, Yongin-si (KR); Kyung-Hwan Ko, Gimhae-si (KR); Yong-Ho Baek, Seoul (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 209 days.

(21) Appl. No.: 15/041,925

(22) Filed: Feb. 11, 2016

(65) Prior Publication Data
US 2016/0242277 A1    Aug. 18, 2016

(30) Foreign Application Priority Data

Feb. 12, 2015    (KR) .......... 10-2015-0021766

(51) Int. Cl.
| H05K 3/46 | (2006.01) |
| H05K 3/40 | (2006.01) |
| H05K 3/28 | (2006.01) |
| H05K 1/11 | (2006.01) |

(52) U.S. Cl.
CPC ......... *H05K 3/4697* (2013.01); *H05K 3/4007* (2013.01); *H05K 1/113* (2013.01); *H05K 3/282* (2013.01); *H05K 3/4644* (2013.01); *H05K 2201/09472* (2013.01)

(58) Field of Classification Search
None
See application file for complete search history.

(56) References Cited

U.S. PATENT DOCUMENTS

| 4,354,895 | A | * | 10/1982 | Ellis ...................... H05K 3/205 156/150 |
| 4,970,107 | A | * | 11/1990 | Akahoshi ............... H05K 3/384 156/60 |
| 5,021,296 | A | * | 6/1991 | Suzuki ................... H05K 3/384 361/748 |
| 5,072,283 | A | * | 12/1991 | Bolger .................. H01L 23/057 257/672 |
| 5,165,984 | A | * | 11/1992 | Schoenthaler ......... H05K 3/325 174/250 |
| 5,378,857 | A | * | 1/1995 | Swailes ................. H05K 1/111 174/251 |
| 5,677,715 | A | * | 10/1997 | Beck .................... B41J 2/16511 347/29 |
| 5,759,737 | A | * | 6/1998 | Feilchenfeld ............ G03F 7/00 257/E21.503 |

(Continued)

*Primary Examiner* — Dimary S Lopez Cruz
*Assistant Examiner* — Muhammed Azam
(74) *Attorney, Agent, or Firm* — NSIP Law

(57) ABSTRACT

A printed circuit board includes a first substrate including a first insulation layer and a first circuit layer including a bonding pad, the bonding pad disposed on the first insulation layer, a second substrate disposed on the first substrate and having a cavity exposing the bonding pad to an outside, and a dam disposed between the bonding pad and an inner wall of the cavity.

20 Claims, 10 Drawing Sheets

(56) References Cited

U.S. PATENT DOCUMENTS

| | | | | |
|---|---|---|---|---|
| 6,204,454 B1* | 3/2001 | Gotoh | H01L 23/10 | 156/153 |
| 6,596,384 B1* | 7/2003 | Day | H05K 1/0242 | 174/250 |
| 7,045,391 B2* | 5/2006 | Lin | H01L 23/49816 | 257/E23.069 |
| 7,332,816 B2* | 2/2008 | Hirose | H05K 1/0256 | 174/261 |
| 7,807,511 B2* | 10/2010 | Mangrum | H01L 23/49811 | 174/521 |
| 7,894,203 B2* | 2/2011 | Kariya | H01L 23/49827 | 361/763 |
| 8,253,034 B2* | 8/2012 | Kim | H01L 21/563 | 174/262 |
| 8,963,016 B2* | 2/2015 | Yokota | H01L 24/18 | 174/255 |
| 9,716,059 B2* | 7/2017 | Inagaki | H01L 23/49822 | |
| 10,045,436 B2* | 8/2018 | Cho | H01L 24/97 | |
| 2004/0188123 A1* | 9/2004 | Peterson | H01L 23/296 | 174/523 |
| 2004/0191491 A1* | 9/2004 | Sugaya | H05K 3/20 | 428/209 |
| 2006/0162957 A1* | 7/2006 | Kindermann | H01L 23/13 | 174/255 |
| 2008/0128288 A1* | 6/2008 | Hashimoto | H05K 3/205 | 205/125 |
| 2008/0245549 A1* | 10/2008 | Kodani | H05K 3/205 | 174/126.1 |
| 2008/0280032 A1* | 11/2008 | Chen | H05K 3/205 | 427/97.3 |
| 2009/0095508 A1* | 4/2009 | Park | H01L 21/4846 | 174/250 |
| 2009/0152233 A1* | 6/2009 | Cho | H05K 1/183 | 216/13 |
| 2009/0288870 A1* | 11/2009 | Kondo | H01L 21/4846 | 174/261 |
| 2010/0009178 A1* | 1/2010 | Weidinger | H05K 3/4691 | 428/336 |
| 2010/0140100 A1* | 6/2010 | Kim | H05K 3/205 | 205/125 |
| 2011/0061905 A1* | 3/2011 | Hwang | H05K 1/0271 | 174/255 |
| 2011/0284267 A1* | 11/2011 | Chang | H05K 3/4697 | 174/250 |
| 2012/0043127 A1* | 2/2012 | Lin | H05K 1/0203 | 174/266 |
| 2012/0168212 A1* | 7/2012 | Ha | H05K 3/383 | 174/257 |
| 2013/0032388 A1* | 2/2013 | Lin | H01L 23/3121 | 174/261 |
| 2013/0299223 A1* | 11/2013 | Yoo | H05K 3/4697 | 174/259 |
| 2014/0054074 A1* | 2/2014 | Shen | H05K 1/092 | 174/257 |
| 2014/0175663 A1* | 6/2014 | Chen | H01L 21/768 | 257/774 |
| 2014/0196939 A1* | 7/2014 | Nishida | H05K 3/28 | 174/261 |
| 2014/0202746 A1* | 7/2014 | Anderson | H01L 21/76847 | 174/255 |
| 2015/0001738 A1* | 1/2015 | Shimizu | H05K 1/115 | 257/778 |
| 2015/0009645 A1* | 1/2015 | Kaneko | H05K 1/181 | 361/767 |
| 2015/0014020 A1* | 1/2015 | Kaneko | H05K 3/4007 | 174/250 |
| 2015/0034366 A1* | 2/2015 | Yoshioka | H05K 1/111 | 174/251 |
| 2015/0223332 A1* | 8/2015 | Nishida | H01L 21/563 | 174/261 |
| 2016/0037645 A1* | 2/2016 | Lee | H05K 3/4697 | 361/761 |
| 2016/0043024 A1* | 2/2016 | Furutani | H01L 23/49827 | 361/783 |
| 2016/0120033 A1* | 4/2016 | Furusawa | H01L 23/13 | 174/251 |

* cited by examiner

PRINTED CIRCUIT BOARD WITH DAM AROUND CAVITY AND MANUFACTURING METHOD THEREOF

CROSS-REFERENCE TO RELATED APPLICATIONS

This application claims the benefit under 35 USC 119(a) of Korean Patent Application No. 10-2015-0021766, filed on Feb. 12, 2015, in the Korean Intellectual Property Office, the entire disclosure of which is incorporated herein by reference for all purposes.

BACKGROUND

1. Field

The present disclosure relates to a printed circuit board and a method of manufacturing the same.

2. Description of Related Art

Electronic products of information technology such as mobile phones and terminals are becoming increasingly multi-functional, slim, light, and small. In order to cope with these technical requirements, a technology for embedding electronic components such as integrated chips (IC), semiconductor chips, active elements and passive elements in a circuit board has been developed. Embedded printed circuit board refers to a technology that involves embedding electronic components in a circuit board. Generally, in order to insert electronic components into a circuit board, a cavity is formed in an insulation layer of the circuit board. Then, electronic components such as various elements, ICs, and semiconductor chips are inserted into the cavity.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes a first substrate including a first insulation layer and a first circuit layer including a bonding pad, the bonding pad disposed on the first insulation layer, a second substrate disposed on the first substrate and having a cavity exposing the bonding pad to an outside, and a dam disposed between the bonding pad and an inner wall of the cavity.

The dam may include a solder resist.

The second substrate may include two or more second insulation layers and two or more second circuit layers.

The general aspect of the printed circuit board may further include a protection layer that is disposed on the second substrate.

The protection layer may include a solder resist.

The first substrate may include two or more first insulation layers and two or more first circuit layers.

In another general aspect, a method of manufacturing a printed circuit board involves forming a first substrate including an first insulation layer and a first circuit layer, the first circuit layer including a bonding pad that is disposed on the first insulation layer, forming a dam on a side surface of the bonding pad, forming a barrier on the dam and the bonding pad that is exposed to an outside, forming a second substrate having a cavity on the first substrate, and removing the barrier.

The forming of the first substrate may involve forming the first substrate to comprise two or more first insulation layers and two or more first circuit layers.

The forming of the dam may involve forming the dam on the bonding pad to expose a portion of an upper surface of the bonding pad to the outside.

The general aspect of the method may further involve, after the removing of the barrier, removing the dam that is formed on the upper surface of the bonding pad.

The dam may include a solder resist.

The barrier may be formed by a sputtering process.

The barrier may be formed of a material that is different from the bonding pad.

The barrier and the bonding pad may be reactive to different etching solutions.

The forming of the second substrate may involve forming the second substrate to include two or more second insulation layers and two or more second circuit layers.

The barrier may be formed of a material that is different from the second circuit layer.

The barrier and the second circuit layer may be reactive to different etching solutions.

The general aspect of the method may further involve, after the forming of the second substrate, forming a protection layer on the second substrate.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
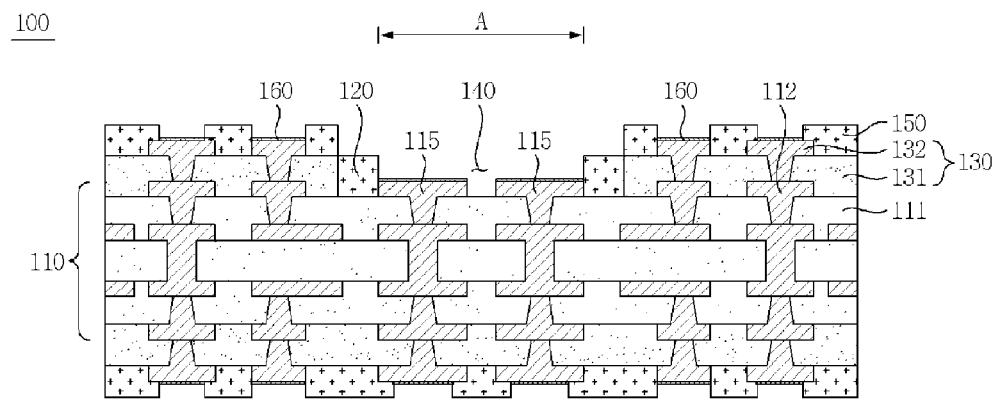
FIG. 1 is a cross-sectional view illustrating an example of a printed circuit board.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Throughout the accompanying drawings, the same reference numerals are used to designate the same or similar components, and redundant descriptions thereof are omitted. Further, in the following description, the terms "first", "second", "one side", "the other side", and the like are used to differentiate a certain component from other components, but the configuration of such components should not be construed to be limited by the terms. Further, in the present description, when it is determined that the detailed description of the related art would obscure the gist of the disclosure, the description thereof will be omitted.

Hereinafter, various examples will be described in detail with reference to the attached drawings.

FIG. 1 illustrates an example of a printed circuit board according to the present disclosure.

Referring to FIG. 1, a printed circuit board 100 includes the first substrate 110, the second substrate 130, a dam 120, a protection layer 150, and a surface treatment layer 160.

In this example, the first substrate 110 includes a first insulation layer 111 and a first circuit layer 112.

The first insulating layer 111 may be made of a composite polymer resin used as an interlayer insulating material. For example, the first insulating layer 111 may be made of an epoxy based resin, such as a prepreg, an Ajinomoto build-up film (ABF), FR-4, and bismaleimide triazine (BT). However, a material that forms the first insulating layer 111 according to the present disclosure is not limited thereto. The material for the first insulating layer 111 may be selected from insulating materials known to be used in a circuit board.

In this example, the first circuit layer 112 is formed on and beneath a first insulating layer 111. In this example, the first circuit layer 112 includes a bonding pad 115. The bonding pad 115 may be a circuit pattern among the first circuit layer 112 that is electrically connected to an external component. In this example, the bonding pad 115 is exposed to the outside by a cavity 140.

According to one example of the present disclosure, the first circuit layer 112 may be formed of any conductive material that may be used in the circuit board field. For example, the first circuit layer 112 may be formed of a copper (Cu).

Referring to FIG. 1, the first circuit layer 112 that is formed on the first insulation layer 111 is illustrated to include the bonding pad 115. But, the bonding pad 115 may be also included on the first circuit layer 112 that is formed beneath the first insulation layer 111. Also, the bonding pad 115 may be included in the first circuit layers that are formed on and beneath the first insulation layer 111.

Figure 3:
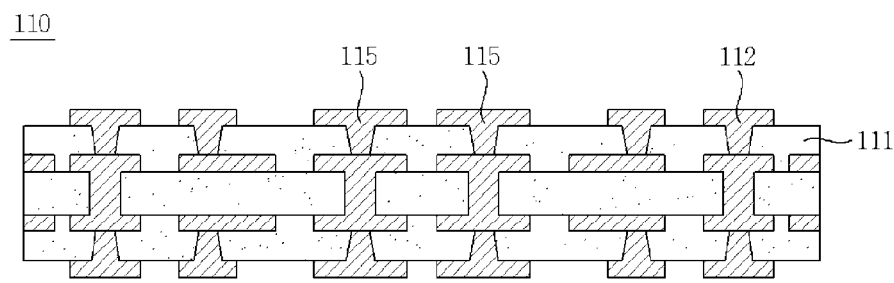
FIGS. 3 through 14 are cross-sectional views illustrating an example of a method of manufacturing a printed circuit board.

According to one example of the present disclosure, the first substrate 110 may include more than one of the first insulation layer 111 and the first circuit layer 112. That is, as shown in FIG. 3, the first substrate 110 may include a plurality of the first insulation layers 111 and a plurality of the first circuit layers 112. Via for electrically connecting the first circuit layers 112 that are formed on different layers may be formed. Also, the first substrate 110 may include one of the first insulation layer 111 and one of the first circuit layer 112.

Referring to FIG. 1, the second substrate 130 is formed on the first substrate 110. Also, the second substrate 130 is formed beneath the first substrate 110 as shown in FIG. 1.

As illustrated in FIG. 1, the second substrate 130 may include the second insulation layer 131 and the second circuit layer 132.

The second insulating layer 121 may be made of a composite polymer resin used as an interlayer insulating material. For example, the second insulating layer 131 may be made of an epoxy based resin, such as a prepreg, an Ajinomoto build-up film (ABF), FR-4, and bismaleimide triazine (BT). However, according to another example of the present disclosure, a material forming the second insulating layer 131 is not limited thereto. The material for the second insulating layer 131 may be selected, for example, from other insulating materials known to be used in a circuit board.

In this example, the second circuit layer 132 is formed on the second insulating layer 131. In case that the number of the second circuit layer 132 is one, the second circuit layer 132 may be formed on and beneath the second insulation layer 131. In case that the number of the second circuit layer 132 is more than two, the second circuit layer 132 may be further formed in the second insulation layer 131.

The second circuit layer 132 according to the present disclosure may be formed of any conductive material that may be used in the circuit board field. For example, the first circuit layer 132 may be formed of a copper (Cu).

Referring to FIG. 1, a cavity 140 is formed in the second substrate 130. According to one example of the present disclosure, the cavity is formed to penetrate the second substrate 130. By the cavity that is formed in this way, the bonding pad 115 of the first substrate 110 is exposed to the outside. Although not shown in FIG. 1, an electronic component (not shown) may be disposed in the cavity 140 to be electrically connected to the bonding pad 115.

In this example, the dam 120 is formed in the cavity 140 on the first substrate 110. That is, the dam 120 that is formed on the first substrate 110 may be exposed to the outside by the cavity 140. Also, the dam 120 that is formed is provided on a side surface of the bonding pad 115. That is, the dam 120 is formed between an inner wall of the cavity 140 and the bonding pad 115. The dam 120 that is formed in this way may prevent the second insulation layer 131 from flowing in the bonding pad 115 when the second substrate 130 is formed. For example, the dam 120 may be formed of a solder resist.

The protection layer 150 is formed on and beneath the second substrate 130. That is, the protection layer 150 is formed on the second substrate 110 that is formed on the first substrate 110, and beneath the second substrate 130 that is formed beneath the first substrate 110.

In this example, the protection layer 150 is formed to cover the second circuit layer 132 to protect the second circuit layer 132 from the outside. The protection layer may be formed to expose a circuit pattern to be electrically connected to the outside.

The protection layer 150 may be made of a heat resistant covering material. For example, the protection layer 150 may be formed of a solder resist.

According to the illustrated example of the present disclosure, the surface treatment layer 160 is formed on a portion of the second circuit layer that is exposed to the outside by the protection layer 150. Also, the surface treatment surface 160 is formed on the bonding pad 115 that is exposed to the outside by the cavity 140.

The surface treatment layer 160 may be formed to prevent the second circuit layer 132 and the bonding pad 115 that are exposed to the outside from corrosion and oxidation. For example, the surface treatment layer 160 may be formed of at least one of nickel, tin, gold, and palladium. Alternatively, the surface treatment layer 160 may be formed of organic solder ability preservative (OSP). However, a material forming the surface treatment layer 160 is not limited thereto. The material for the surface treatment layer 160 may be selected from other surface treatment materials known to be used in a circuit board.

Figure 2:
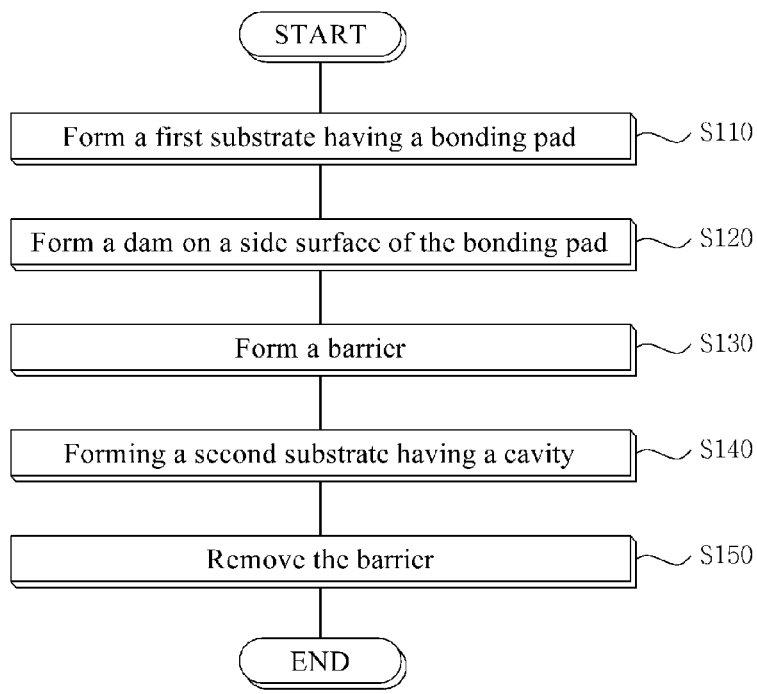
FIG. 2 is a flowchart illustrating an example of a method of manufacturing a printed circuit board.

FIG. 2 is a flowchart illustrating an example of a method of manufacturing a printed circuit board.

FIGS. 3 through 15 illustrate an example of a method of manufacturing a printed circuit board according to FIG. 2.

The example of the method of manufacturing the printed circuit board according to FIG. 2 will be described in detail with reference to FIGS. 3 through 15.

Referring to FIG. 3, the first substrate 110 is formed (S110 in FIG. 2).

The first substrate 110 may include the first insulation layer 111 and the first circuit layer 112.

According to one example, the first insulating layer 111 may be made of a composite polymer resin used as an interlayer insulating material. For example, the first insulating layer 111 may be made of an epoxy based resin, such as a prepreg, an Ajinomoto build-up film (ABF), FR-4, and bismaleimide triazine (BT). However, a material forming the first insulating layer 111 according to the present disclosure is not limited thereto. In another example, the material for forming the first insulating layer 111 may be selected from other insulating materials known to be used in a circuit board.

The first circuit layer 112 is formed on and beneath the first insulating layer 111. That is, the first circuit layer 112 may cover both a side and a top surface of the first insulating layer 111. In this example, the first circuit layer 112 also includes a bonding pad 115. However, the present disclosure is not limited thereto. Referring to FIG. 3, the bonding pad 115 may be a circuit pattern among the first circuit layer 112 that is electrically connected to an external component. The bonding pad may be formed in a cavity region A in which the cavity (not shown) will be formed. In FIG. 3, the first circuit layer 112 that is formed on the first insulation layer 111 is illustrated to include the bonding pad 115. However, the bonding pad may be also included on the first circuit layer 112 that is formed beneath the first insulation layer 111. Also, the bonding pad 115 may be included in the first circuit layers that are formed on and beneath the first insulation layer 111.

The first circuit layer 112 may be formed of any conductive material that may be used in the circuit board field. Also, the first circuit layer 112 may be formed of the material that is different from a material that forms a barrier (not shown) to be formed on the bonding pad 115. The first circuit layer may be formed of the material that is unreactive to an etching solution for the barrier (not shown). For example, in an example in which the barrier is made of titanium, the first circuit layer 112 may be formed of copper.

In one embodiment of the present disclosure, the first circuit layer 112 may be formed by a circuit pattern forming process such as tenting process, a semi-additive process (SAP), a modified semi-additive process (MSAP) and the like, which may be used in the circuit board field.

Referring to FIG. 3, in the illustrated example according to the present disclosure, the first substrate 110 includes more than one of the first insulation layer 111 and the first circuit layer 112. That is, the first substrate 110 includes a plurality of the first insulation layers 111 and a plurality of the first circuit layers 112. Vias are formed to electrically connect the multiple layers of first circuit layers 112. Also, the first substrate 110 may include one of the first insulation layer 111 and one of the first circuit layer 112.

Hereinafter, it will be described based on an upper surface of the first insulation layer 111. But, except that the cavity (not shown) is formed, those who skilled in the art may understand that same order and method may be applied to a lower surface of the first insulation layer 111. Also, by the choice of those who skilled in the art, the cavity (not shown) may be formed beneath the second insulation layer 131.

Figure 4:
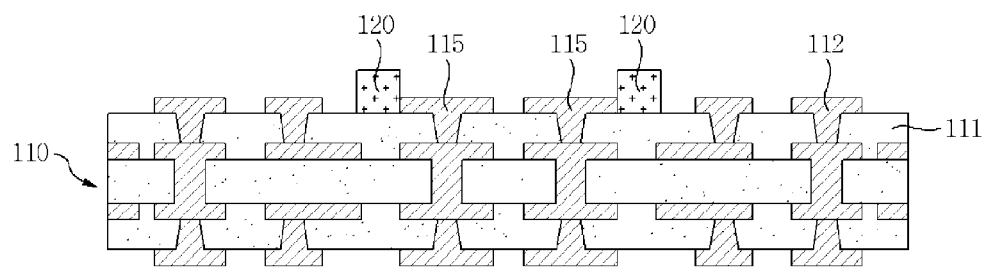

Referring to FIG. 4, the dam 120 is formed on the side surface of the bonding pad 115 (S120 in FIG. 2).

In this example, the dam 120 is formed on the first insulation layer 111 in the cavity region A. The dam 120 may be formed on the side surface of the bonding pad 115 to expose an upper surface of the bonding pad 115 to the outside.

In one embodiment of the present disclosure, The dam 120 that is formed in this way may prevent the second insulation layer 131 from flowing in the bonding pad 115 when the second substrate (not shown) is formed. For example, the dam 120 is formed of a solder resist.

Figure 5:
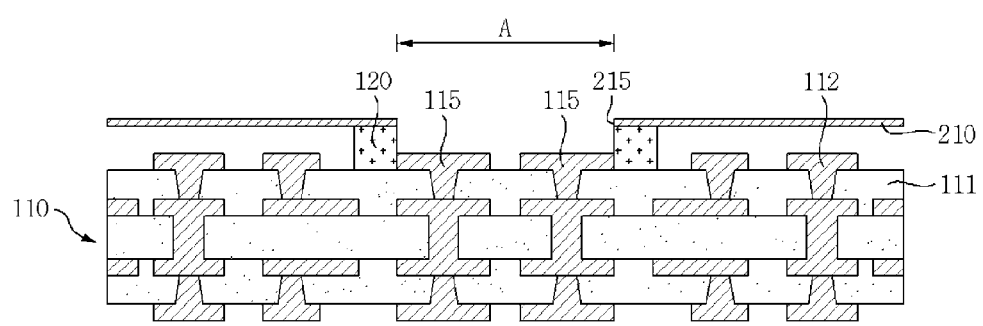
Figure 6:
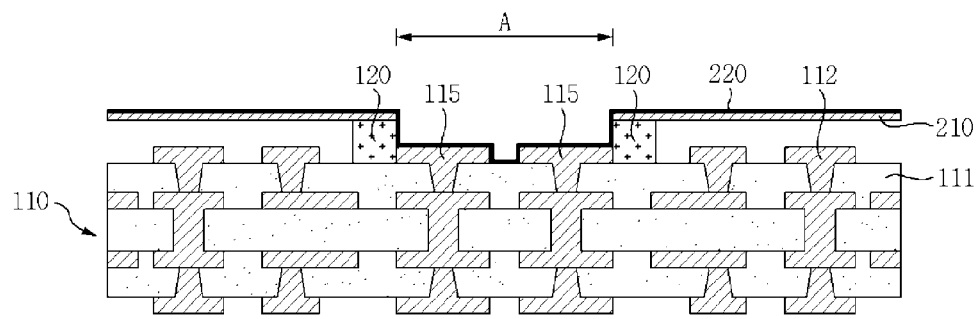
Figure 7:
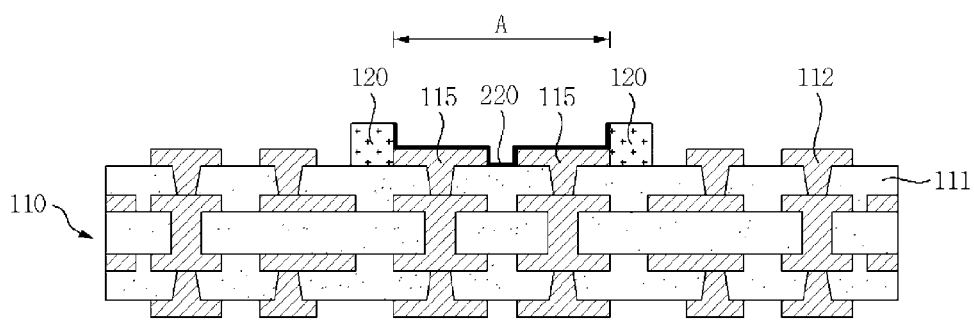

Referring to FIGS. 5 through 7, the barrier 220 is formed (S130 in FIG. 2).

Referring to FIG. 5, a mask 210 is disposed on the first substrate 110 and the dam 120.

In this example, an opening 215 that exposes the bonding pad 115 that is exposed by the dam 120 is formed in the mask 210. That is, the mask 210 is formed to protect the first substrate 110 from the outside except the bonding pad 115. When the bonding pad 115 is plated, the mask 210 may be formed to protect remaining structure except the area where the bonding pad 115 is provided. According to one example of the present disclosure, although the mask 210 may be formed not to expose the dam 120 in the cavity region A, however, this may be changed by the choice of those who skilled in the art. The dam 120 may also function as a plating resist when the plating process is performed on the bonding pad 115. That is, both the mask 210 and the dam 120 may function as the plating resist so that it may be possible to form the opening 215 having width "A" to expose at least a portion of the dam 120.

The material for the mask 210 may be selected from materials for forming plating resist known to be used in a circuit board.

Referring to FIG. 6, the barrier 220 is formed.

In this example, the barrier 220 is formed on the portion that is exposed by the mask 210. According to one example of the present disclosure, the barrier 220 may be formed by sputtering process.

The barrier 220 may be formed of a material that is different from the first circuit layer 112. Also, the barrier 220 may be formed of a material that is different from the second layer (not shown). The barrier 220 may be formed of a material that is unreactive to the etching solution of the second circuit layer (not shown). For example, if the second circuit layer (not shown) is formed of copper, the barrier may be formed of titanium.

According to one example of the present disclosure, since the barrier may be formed by the sputtering process, it may be formed to be very thin.

Referring to FIG. 7, the mask (210 in FIG. 6) is removed.

Referring to FIGS. 8 through 12, the second substrate 130 is formed (S140 in FIG. 2). The second substrate 130 may have a cavity 140 formed therein.

Figure 8:
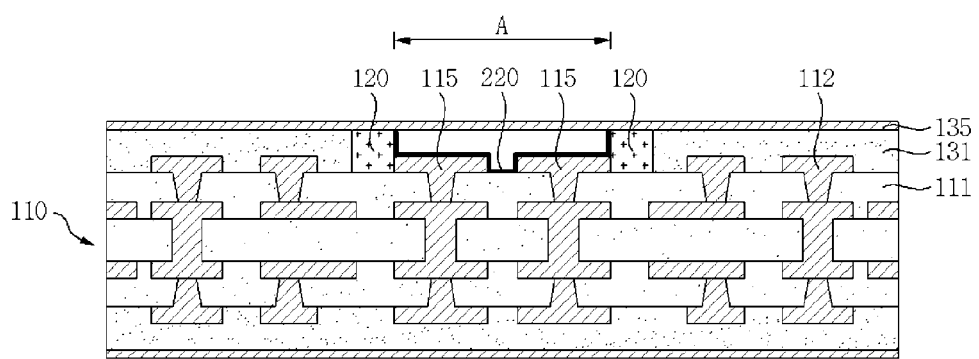

Referring to FIG. 8, the second insulation layer 131 is formed.

The second insulation layer 131 is formed on the first substrate 110. The second insulation layer 131 includes a region corresponding to the cavity region A that is punched. The second insulating layer 131 may be made of a composite polymer resin used as an interlayer insulating material. For example, the second insulating layer 131 may be made of an epoxy based resin, such as a prepreg, an Ajinomoto build-up film (ABF), FR-4, and bismaleimide triazine (BT). However, according to one example, a material forming the second insulating layer 131 is not limited thereto. The material for the second insulating layer 131 may be selected from other insulating materials known to be used in a circuit board.

The second insulation layer 131 may be formed by being laminated and pressed on the first substrate 110. Due to the hot temperature, the flowability of the second insulation layer 131 may increase. The dam 120 may prevent the second insulation layer 131 from flowing in the cavity region A. Accordingly, the dam may prevent a failure that the second insulation layer 131 covers the bonding pad 115.

In one embodiment of the present disclosure, the second insulation layer 131 on which the metal layer 135 is formed may be laminated on the first substrate 110. It may be possible to form the metal layer 135 after the second insulation layer is formed on the first substrate 110.

The material for the metal layer 135 may be selected from conductive materials known to be used in a circuit board. Also, the metal layer 135 may be formed of the material that is different from the barrier 220. For example, the metal layer 135 may be formed of copper.

Figure 9:
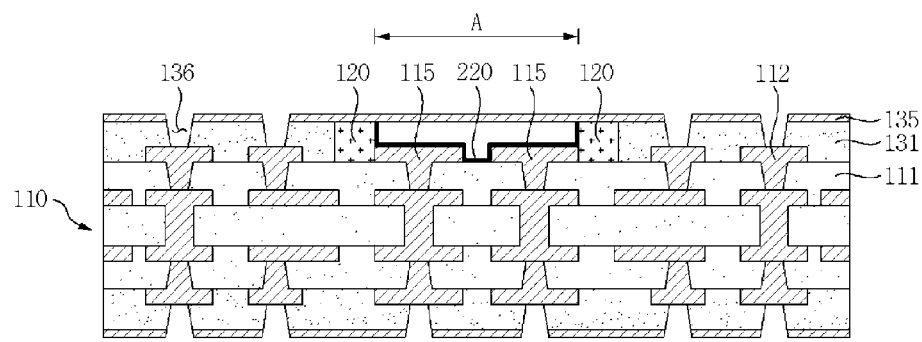

Referring to FIG. 9, the via hole 136 is formed.

In this example, the via hole 136 is formed on the first circuit layer 112, and penetrates the second insulation layer 131 and the metal layer 135. Accordingly, the upper surface of the first circuit layer 112 is exposed by the via hole 136.

The via hole 136 may be formed by any via hole processing methods used in manufacturing a circuit board. For example, the via hole 136 may be formed by laser processing.

Figure 10:
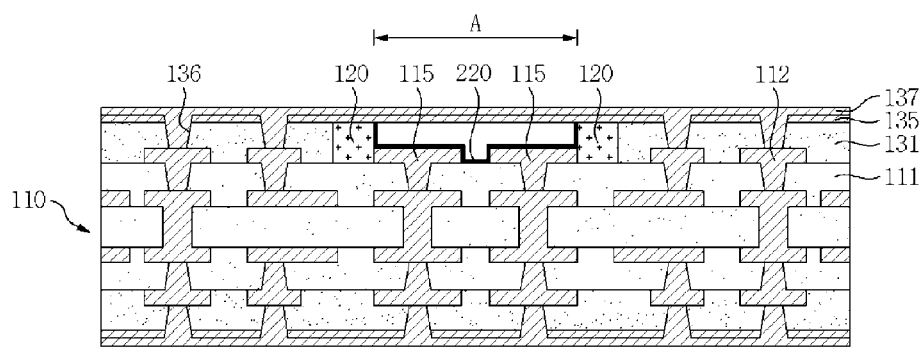

Referring to FIG. 10, plating process is performed.

According to one example of the present disclosure, the plating layer 137 may be formed on the via hole 136 and the metal layer 135 by perform the plating process.

The plating layer 137 may be formed the electroplating process.

The material for the plating layer 137 may be selected from conductive materials known to be used in a circuit board. Also, the plating layer 137 may be formed of a material that is different from the barrier 220. For example, the plating layer 137 may be formed of copper.

Figure 11:
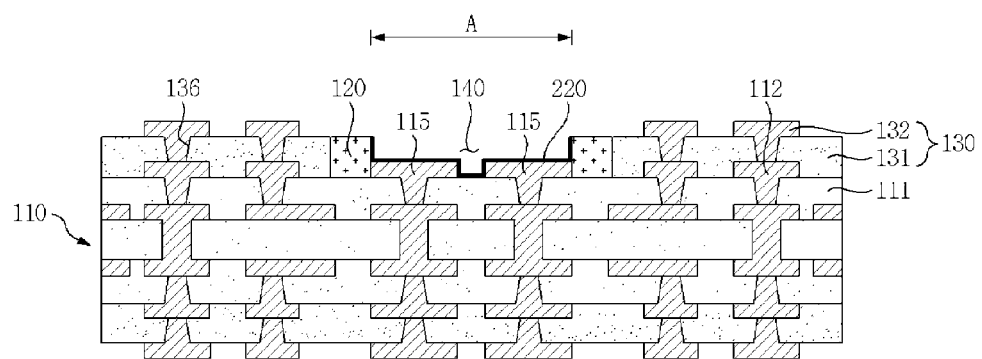
Figure 12:
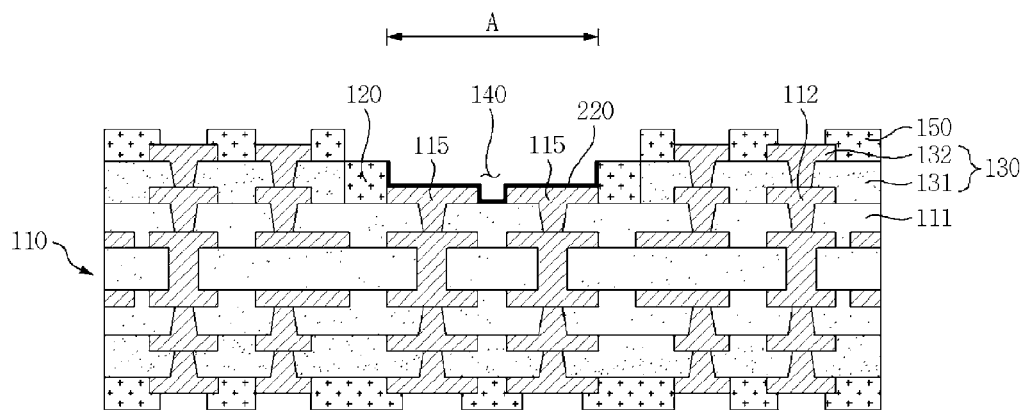

Referring to FIG. 11, the second circuit layer 132 is formed.

The metal layer (135 in FIG. 10) and the plating layer (137 in FIG. 10) that are formed on the second insulation layer 131 may be patterned to be the second circuit layer 132. For example, a portion of the metal layer (135 in FIG. 10) and the plating layer (137 in FIG. 10) may be removed by an etching solution to be the second circuit layer 132. The metal layer (135 in FIG. 10) and the plating layer (137 in FIG. 10) that are formed in the cavity region A may be removed to be the cavity 140.

According to one example of the present disclosure, the barrier 220 may not be reactive to the etching solution when patterning the second circuit layer 132. Thus, the barrier may protect the bonding pad 115 from the etching solution when patterning the second circuit layer 132.

As described above, the second substrate 130 in which the cavity 140 is formed is formed through FIGS. 8 through 11.

According to one example of the present disclosure, it may be possible to form the second substrate to have a plurality of the second insulation layers 131 and the second circuit layers 132 by repeating the process shown in FIGS. 8 through 11.

Referring to FIG. 11, the protection layer 150 is formed.

In this example, the protection layer 150 is formed on the second substrate 130 to cover the second circuit layer 132. The protection layer 150 may be formed to protect the second circuit layer from the outside. The protection layer 150 may be formed to expose the circuit pattern to be electrically connected to the outside among the second circuit layer 132.

The protection layer 150 may be made of a heat resistant covering material. For example, the protection layer 150 may be formed of a solder resist.

Figure 13:
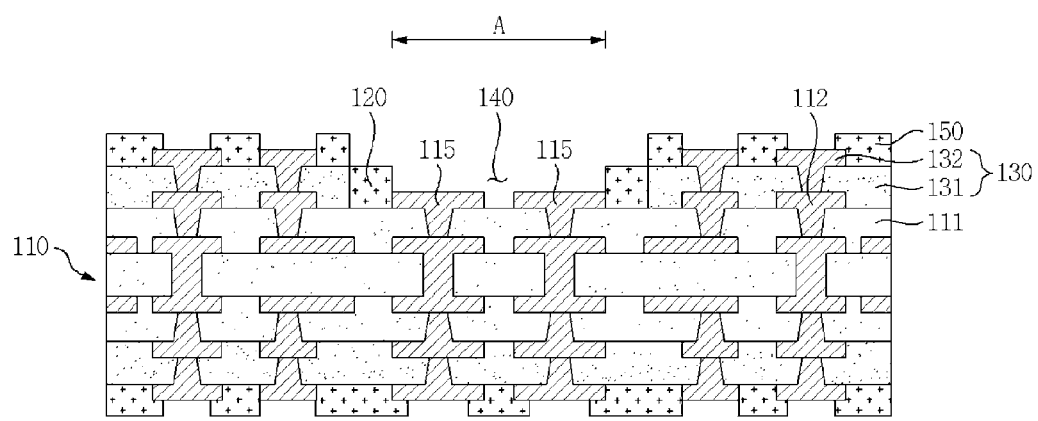

Referring to FIG. 13, the barrier (220 in FIG. 12) is removed (S150 in FIG. 2).

The barrier (220 in FIG. 12) may be removed, for example, by an etching solution. The first circuit layer 112 may not be reactive to the etching solution that is used to remove the barrier (220 in FIG. 12). Thus, the bonding pad 115 may not be removed when the barrier (220 in FIG. 12) is removed.

According to one example of the present disclosure, the barrier may be removed (220 in FIG. 12) after forming the protection layer 150. Alternately, it is also possible to form the protection layer 150 after the barrier (220 in FIG. 12) is removed.

Figure 14:
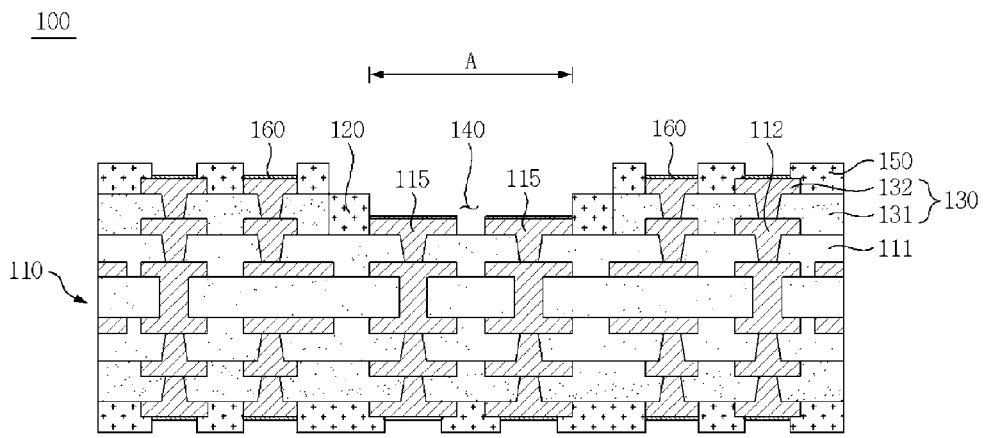

Referring to FIG. 14, the surface treatment layer 160 is formed.

In this example, the surface treatment layer 160 is formed on the second circuit layer 132 that is exposed to the outside by the protection layer 150. Also, the surface treatment layer 160 is formed on the bonding pad 115 that is exposed to the outside by the cavity 140.

The surface treatment layer 160 may be formed to prevent the second circuit layer 132 and the bonding pad 115 that are exposed to the outside from corrosion and oxidation. For example, the surface treatment layer 160 may be formed by plating of nickel, tin, gold, palladium, or the like. Alternatively, the surface treatment layer 160 may be formed of organic solder ability preservative (OSP). As such, the surface treatment layer 160 may be formed by any surface treatment processing known to be used in a circuit board manufacturing process. However, a material forming the surface treatment layer 160 is not limited thereto. The surface treatment layer 160 may be selected from various surface treatment materials known to be used in a circuit board. Also, the forming of the surface treatment layer may be omitted by a choice of those who skilled in the art.

Figure 15:
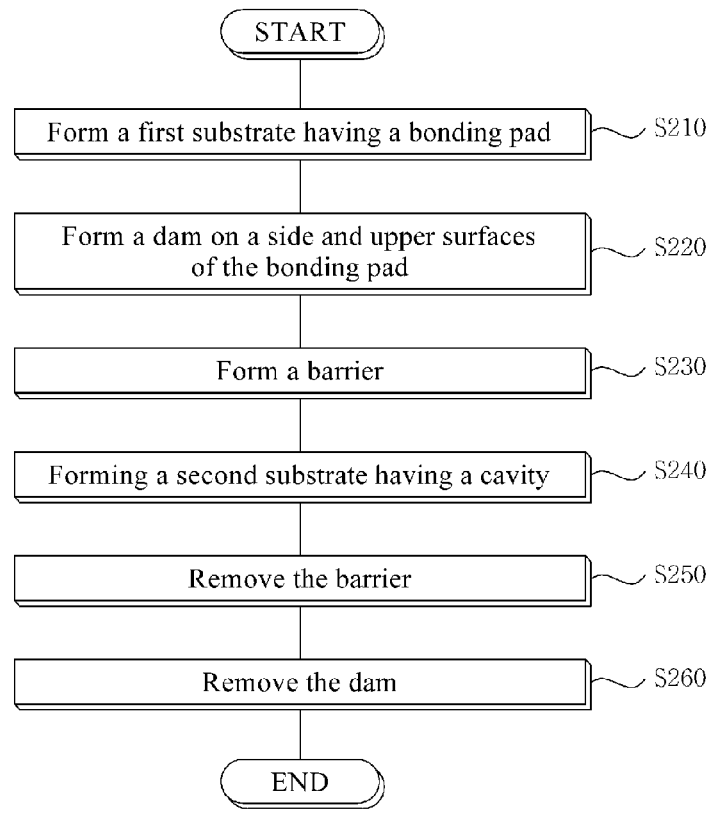
FIG. 15 is a flowchart illustrating another example of a method of manufacturing a printed circuit board.

FIG. 15 illustrates another example of a method of manufacturing a printed circuit board FIGS. 16 through 25 illustrate the method of manufacturing the printed circuit board through cross-sectional views.

That is, the method of manufacturing the printed circuit board according to FIG. 15 are described in detail with reference to FIGS. 16 through 25.

Figure 16:
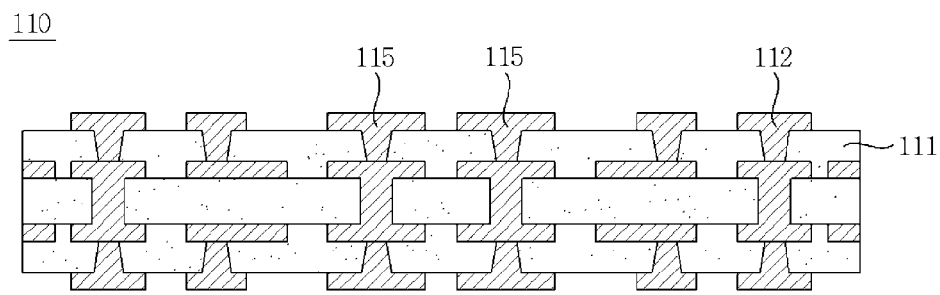
FIGS. 16 through 25 are cross-sectional views illustrating an example of a method of manufacturing a printed circuit board according to the example of FIGS. 3 through 15.

Referring to FIG. 16, the first substrate 110 is formed (S210 in FIG. 15).

The description about the first substrate 110 according to FIG. 16 is substantially identical to that illustrated in FIG. 3. Thus, same description will be omitted here.

Figure 17:
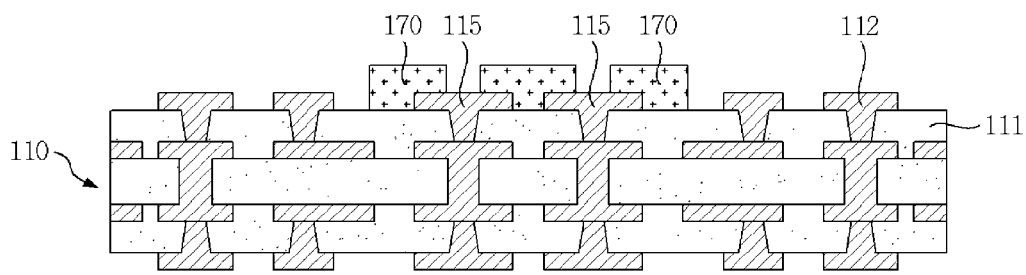

Referring to FIG. 17, the dam 170 is formed (S220 in FIG. 15).

The dam 170 is formed on the first insulation layer 111 in the cavity region A. The dam 170 is formed on the side surface and the upper surface of the bonding pad 115 to expose a portion of the upper surface of the bonding pad 115 to the outside. For example, the dam 170 may be formed of solder resist.

Figure 18:
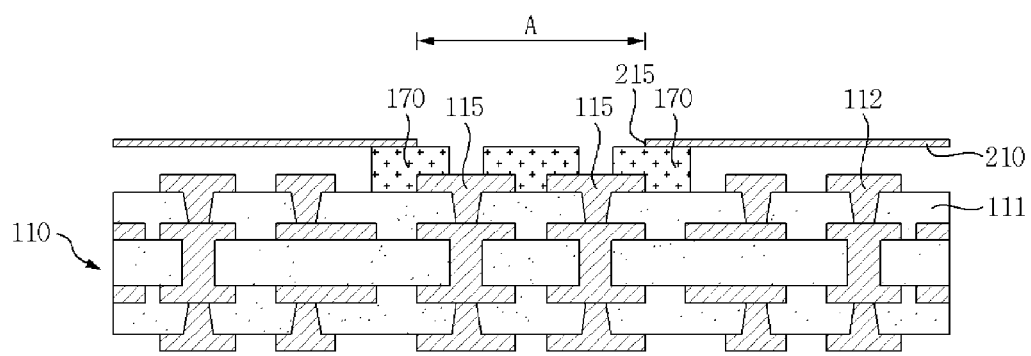
Figure 19:
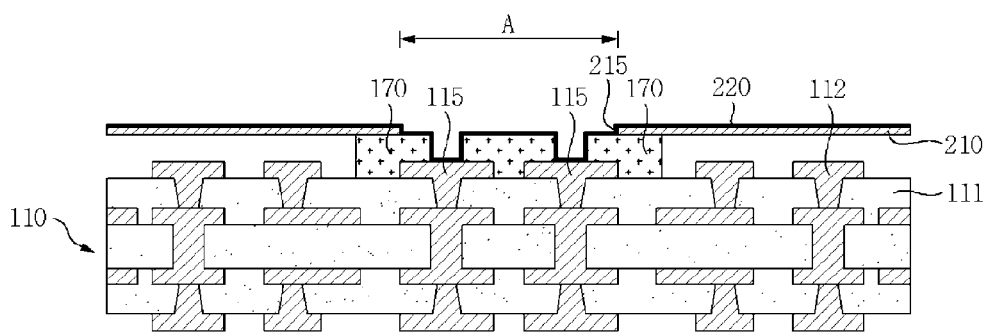
Figure 20:
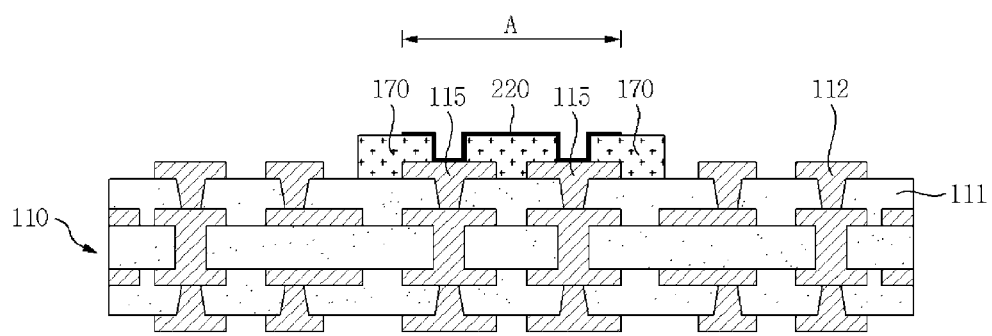

Referring to FIGS. 18 through 20, the barrier 220 is formed (S230 in FIG. 15).

Referring to FIG. 18, a mask 210 is disposed on the first substrate 110 and the dam 170.

An opening 215 that exposes the bonding pad 115 that is exposed by the dam 170 is formed in the mask 210. That is, the mask 210 may be formed to protect the first substrate 110 from the outside except the area where the bonding pad 115 is provided. According to one example, when the bonding pad 115 is being plated, the mask 210 may be formed to protect remaining structure except the area where the bonding pad 115 is provided from the plating process. The dam 170 may also function as a plating resist when the plating process is performed on the bonding pad 115. That is, both the mask 210 and the dam 170 may function as the plating resist so that it may be possible to form the opening 215 to expose at least a portion of the dam 170.

The material for the mask 210 may be selected from plating resist known to be used in a circuit board.

Referring to FIG. 19, the barrier 220 is formed.

In this example, the barrier 220 is formed on the portion that is exposed by the mask 210. The barrier 220 may be formed by sputtering process.

According to one example of the present disclosure, the barrier 220 may be formed of a material that is different from the first circuit layer 112. Also, the barrier 220 may be formed of a material that is different from the second layer (not shown). The barrier 220 may be formed of a material that is unreactive to the etching solution of the second circuit layer (not shown). For example, if the second circuit layer (not shown) is formed of copper, the barrier may be formed of titanium.

Referring to FIG. 20, the mask (210 in FIG. 19) may be removed.

Figure 21:
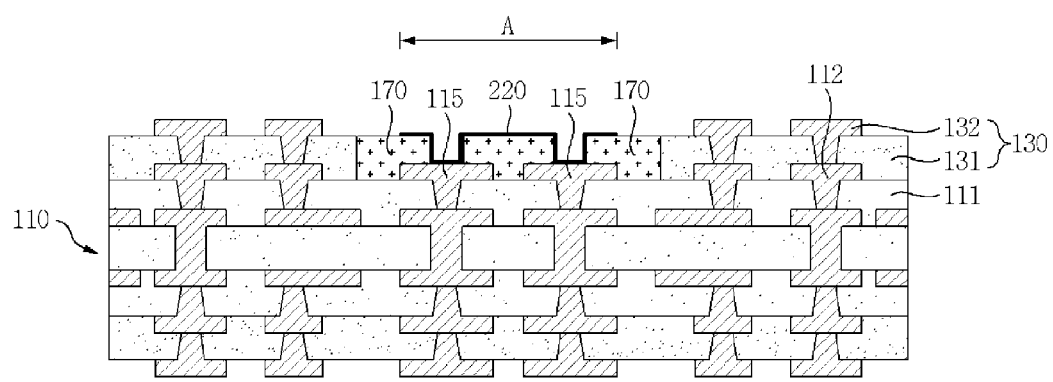

Referring to FIG. 21, the second substrate 130 may be formed (S240 in FIG. 15).

The description about the second substrate 130 according to FIG. 21 is identical to that according to FIGS. 2 to 14. Thus, same description will be omitted here.

Figure 22:
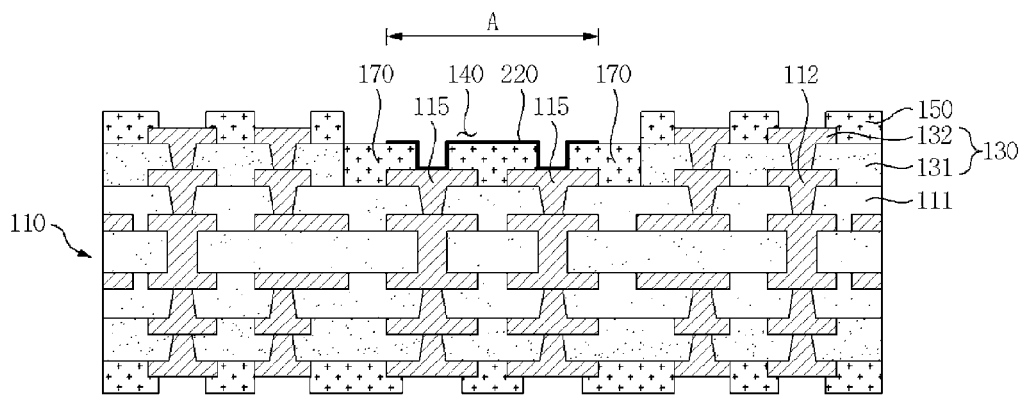

Referring to FIG. 22, the protection layer 150 is formed.

In this example, the protection layer 150 is formed on the second substrate 130 so as to cover the second circuit layer 132. The protection layer 150 may be formed to expose the circuit pattern to be electrically connected to the outside among the second circuit layer 132. The protection layer 150 may be made of a heat resistant covering material. For example, the protection layer 150 may be formed of a solder resist.

Figure 23:
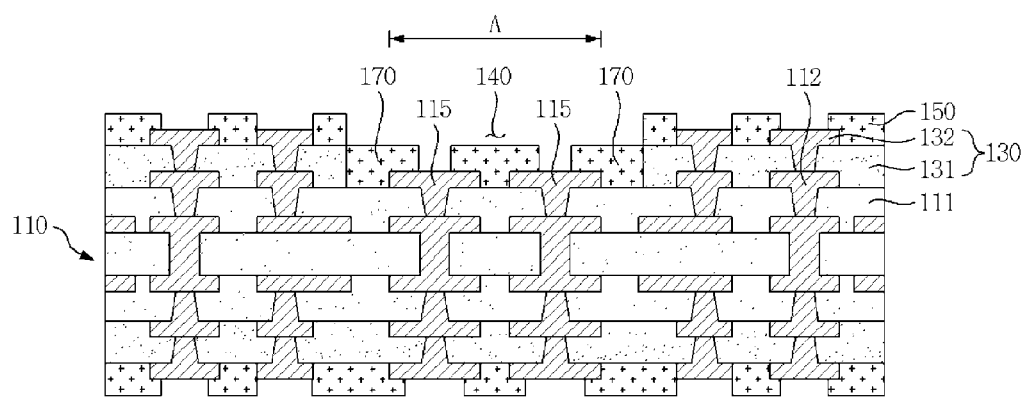

Referring to FIG. 23, the barrier (220 in FIG. 22) is removed (S250 in FIG. 15).

The barrier (220 in FIG. 22) may be removed by an etching solution. The first circuit layer 112 may not be reactive to the etching solution that is used to remove the barrier (220 in FIG. 22). Thus, the bonding pad 115 may not be removed when the barrier (220 in FIG. 22) is removed.

Figure 24:
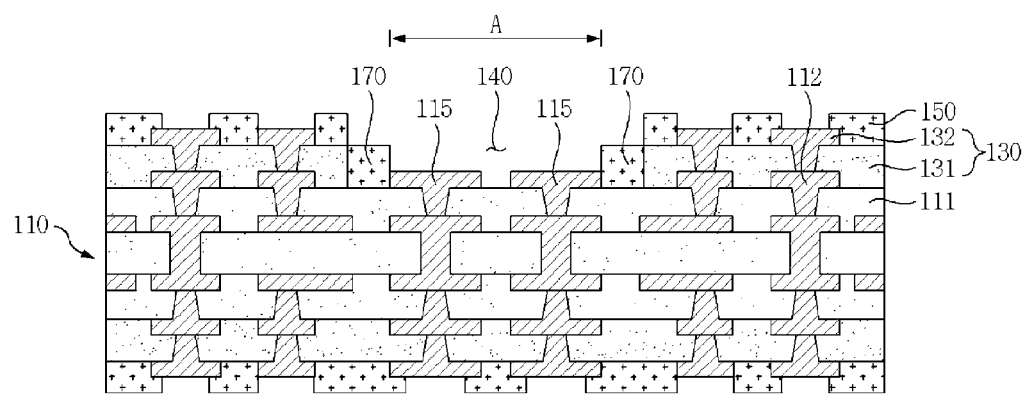

Referring to FIG. 24, the dam 170 is patterned (S260 in FIG. 16).

In this example, the dam 170 is formed to cover a portion of the bonding pad 115. The dam may be patterned to expose the upper portion of the bonding pad 115 to the outside.

The barrier 220 may be removed after the protection layer 150 is formed. Alternatively, it is also possible to form the protection layer 150 after the barrier 220 is removed.

Figure 25:
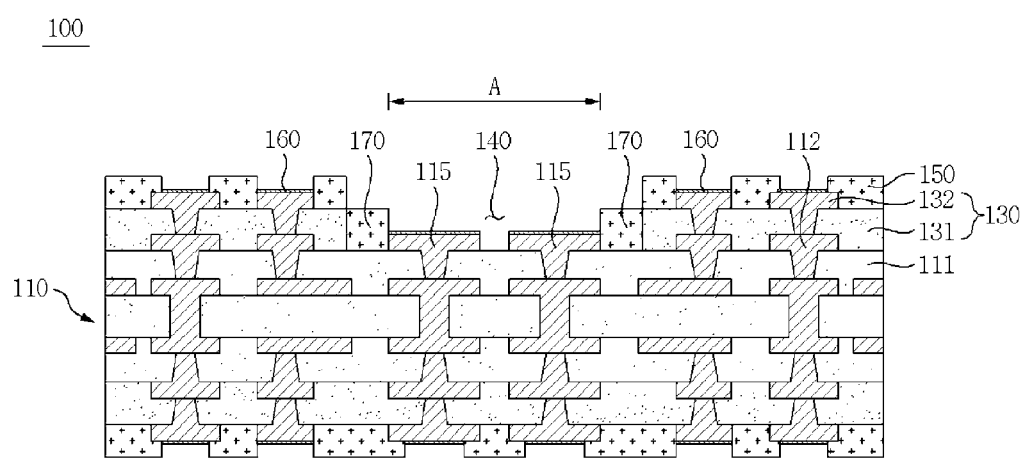

Referring to FIG. 25, the surface treatment layer 160 is formed.

The surface treatment layer 160 is formed on the second circuit layer 132 that is exposed to the outside by the protection layer 150. Also, the surface treatment layer 160 may be formed on the bonding pad 115 that is exposed to the outside by the cavity 140.

The material for the surface treatment layer 160 may be selected from surface treatment materials known to be used in a circuit board. Also, the forming of the surface treatment layer may be omitted by a choice of those who skilled in the art.

Conventionally, in order to protect the bonding pad 115 from the etching solution that is used to form the second circuit layer 132, a thick dry film (not shown) is used. Among the high heat resistant dry films, the thinnest has about 15 μm thickness. But, a thinner insulation layer may be formed around the dry film. A stepped portion may be formed by the difference in heights between the dry film and the second insulation layer 131 due to the thickness of the dry film. As a result, the second insulation layer 131 and the metal layer 135 and the plating layer 137 that are formed on the dry film may be also formed to be stepped structure. This may hinder the adhesion of the etching resist that is formed when the second circuit layer 132 is formed. This may cause a fault in the second circuit layer or may cause the cavity to have a dimension that is different from its designed dimension due to the fact that the etching resist may not adhere to the metal layer 135 and the plating layer 137. Also, a residue may remain because the dry film is not removed properly.

However, according to an example of the present disclosure, instead of using a conventional dry film, the thin barrier 220 may be formed on the exposed portion of the bonding pad 115 by sputtering process. Thus, various reliability issues that may arise due to the height difference resulting from the use of a dry film may be resolved. For example, the fault in the second circuit layer 132 and changes in the dimension of the cavity 140 that may be caused by the height difference resulting from the use of a dry film may be resolved. Also, according to one example of the present disclosure, since the dry film is not used, a residue of the dry film does not remain due to an improper removal of the dry film.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board, comprising:
 a first substrate comprising a first insulation layer and a first circuit layer, the first circuit layer comprising a bonding pad disposed on the first insulation layer;
 a second substrate comprising a second insulation layer and a second circuit layer, the second substrate disposed on the first substrate and having a cavity exposing the bonding pad to an outside; and
 a dam disposed between the bonding pad and an inner wall of the cavity, wherein the dam is disposed completely inside the cavity.

2. The printed circuit board of claim 1, wherein the dam comprises a solder resist.

3. The printed circuit board of claim 1, wherein the second substrate comprises two or more second insulation layers and two or more second circuit layers.

4. The printed circuit board of claim 1 further comprising a protection layer that is disposed on the second substrate.

5. The printed circuit board of claim 4, wherein the protection layer comprises a solder resist.

6. The printed circuit board of claim 1, wherein the first substrate comprises two or more first insulation layers and two or more first circuit layers.

7. A method of manufacturing a printed circuit board, the method comprising:
 forming a first substrate comprising a first insulation layer and a first circuit layer, the first circuit layer comprising a bonding pad disposed on the first insulation layer;
 forming a dam on a side surface of the bonding pad;
 forming a barrier on the dam and the bonding pad that is exposed to an outside;
 forming a second substrate comprising a second insulation layer and a second circuit layer, the second substrate having a cavity and disposed on the first substrate; and
 removing the barrier,
 wherein the dam is disposed completely inside the cavity.

8. The method of claim 7, wherein the forming of the first substrate comprises forming the first substrate to comprise two or more first insulation layers and two or more first circuit layers.

9. The method of claim 7, wherein the forming of the dam comprises forming the dam on the bonding pad to expose a portion of an upper surface of the bonding pad to the outside.

10. The method of claim 9 further comprising, after the removing of the barrier, removing the dam that is formed on the upper surface of the bonding pad.

11. The method of claim 7, wherein the dam comprises a solder resist.

12. The method of claim 7, wherein the barrier is formed by a sputtering process.

13. The method of claim 7, wherein the barrier is formed of a material that is different from the bonding pad.

14. The method of claim 13, wherein the barrier and the bonding pad are reactive to different etching solutions.

15. The method of claim 7, wherein the forming of the second substrate comprises forming the second substrate to comprise two or more second insulation layers and two or more second circuit layers.

16. The method of claim 15, wherein the barrier is formed of a material that is different from the second circuit layer.

17. The method of claim 16, wherein the barrier and the second circuit layer are reactive to different etching solutions.

18. The method of claim 7, further comprising, after the forming of the second substrate, forming a protection layer on the second substrate.

19. A printed circuit board, comprising:
 a first substrate comprising a first insulation layer and a first circuit layer, the first circuit layer comprising a bonding pad disposed on the first insulation layer;
 a second substrate disposed on the first substrate, the second substrate having a first surface opposite to a second surface and a cavity comprising an area extending through a thickness of the second substrate from the first surface to the second surface; and
 a dam disposed completely inside the cavity, in contact with the second substrate, between a perimeter wall of the cavity and the bonding pad.

20. The printed circuit board of claim 1, wherein the dam is disposed in contact with the bonding pad.

* * * * *